United States Patent [19]

Golding et al.

[11] Patent Number: 5,686,351
[45] Date of Patent: Nov. 11, 1997

[54] SEMIMETAL-SEMICONDUCTOR HETEROSTRUCTURES AND MULTILAYERS

[75] Inventors: Terry D. Golding, Missouri City; John H. Miller, Jr., Houston, both of Tex.

[73] Assignee: The University of Houston, Houston, Tex.

[21] Appl. No.: 447,477

[22] Filed: May 23, 1995

Related U.S. Application Data

[62] Division of Ser. No. 916,050, Jul. 17, 1992, Pat. No. 5,449,561.

[51] Int. Cl.$^6$ .................................................. H01L 21/20
[52] U.S. Cl. ............................................. 437/132; 437/200
[58] Field of Search ................................... 437/132, 200

[56] References Cited

U.S. PATENT DOCUMENTS

| | | | |
|---|---|---|---|
| 4,250,515 | 2/1981 | Esaki et al. | 357/16 |
| 4,558,336 | 12/1985 | Chang et al. | 357/4 |
| 4,806,993 | 2/1989 | Voisin et al. | 357/4 |
| 4,847,666 | 7/1989 | Heremans et al. | 357/16 |
| 4,916,495 | 4/1990 | Awano | 357/16 |
| 4,999,694 | 3/1991 | Austin et al. | 357/30 |
| 5,079,601 | 1/1992 | Esaki et al. | 357/4 |
| 5,159,421 | 10/1992 | Wolff | 357/30 |

FOREIGN PATENT DOCUMENTS 62-45064  2/1987  Japan.

OTHER PUBLICATIONS

A.Y. Cho and P.D. Dernier, *J. Appl. Phys.*, 49.3328 (1978).
J. Massies, P. Delescluse, P. Etienne and N.T. Linh, *Thin Solid Films*, 90, 113 (1980).
J.R. Waldrop and R.W. Grant, *Appl. Phys. Lett.*, 34, 630 (1979).
G.A. Prinz and J.J. Krebs, *Appl. Phys. Lett.*, 39.397 (1981).
G.A. Prinz, *Phys. Rev. Lett.*, 54, 1051 (1985).
R. Fashe, J.T. Zborowski, T.D. Golding, H.D. Shih, P.C. Chow, K. Matsuichi, B.C. Covington, A. Chi, J. Zheng, and H.F. Schaake, *Jour. Cryst. Growth*, 111, 677 (1991).
T.D. Golding, H.D. Shih, J.T. Zborowski, W.C. Fan, P.C. Chow, A. Vigliante, B.C. Covington, A. Chi, J.M. Anthony and H.F. Schaake, *J. Vac. Sci. Tech.*, B10(2) (1992) 880–884.
J.T. Zborowski, W.C. Fan, T.D. Golding, A. Vigliante and P.C. Chow, *J. Appl. Phys.* 71(12) (1992) 5908–5912.
T.D. Golding, J.A. Dura, W.C. Wang, J.T. Zborowski, A. Vigliante and J.H. Miller, Jr., *Investigation of Sb/GaSb Multilayer Structures for Potential Application as an Indirect Narrow–Bandgap Material*, Semicond. Sci. Technol. 8 (1993) S117–S120.

(List continued on next page.)

*Primary Examiner*—Robert Kunemund
*Attorney, Agent, or Firm*—Fulbright & Jaworski L.L.P.

[57] ABSTRACT

The present invention provides for the fabrication of single layer semimetal/semiconductor heterostructures and multilayer semimetal/semiconductor structures. Each semimetal/semiconductor layer fabricated in accordance with the present invention has compatible crystal symmetry across the heterojunction between a semimetal and a semiconductor. A single layer semimetal/semiconductor structure is fabricated by growing a rhombohedral semimetal in a [111] direction on a substrate material having a (111) orientation, and then growing a zincblende semiconductor in a [111] direction on the semimetal. A multilayer semimetal/semiconductor structure may be grown from the single layer semimetal/semiconductor structure by growing an additional rhombohedral semimetal layer in a [111] direction on the preceding semiconductor grown, then growing an additional zincblende semiconductor layer in a [111]direction on the additional semimetal layer, and then repeating this process as many times as desired. Each semimetal to be sandwiched between semiconductors in the multilayer semimetal/semiconductor structure may be grown thin enough that the semimetal is converted into a semiconductor.

16 Claims, 3 Drawing Sheets

OTHER PUBLICATIONS

M.A. Hollis, K.B. Nichols, R.A. Murphy, R.P. Gale, S. Rabe, W.J. Piacenti, C.O. Bozler and P.M. Smith, *IEDM Tech. Digest*, 102 (1985).

N. Tabatabaie, T. Sands, J.P. Harbison, H.L. Gilchrist, and V.G. Keramidas, *Appl. Phys. Lett.*, 53, 2528 (1988).

J.W. Sulhoff, J.L. Zyskind, C.A. Burrus, R.D. Feldman, and R.F. Austin, *Appl. Phys. Lett.*, 56, 388 (1990).

M.L. Huberman and J. Maserjian, *Phys. Rev.*, B37, 9065 (1988).

W.A. Little, *Phys. Rev.*, 134, A1416 (1964).

V.L. Ginzburg, *Usp. Fiz. Nauk*, 101, 185 (1970). [*Sov. Phys.—Usp.*, 13, 335 (1970)].

D. Allender, J. Bray, and J. Bardeen, *Phys. Rev.*, B7, 1020 (1973).

C.M. Varma, P.B. Littlewood, S. Schmidt–Rink, E. Abrahams, and A.E. Ruckenstein, *Phys. Rev. Lett.*, 63, 1996 (1989).

A. Virosztek and J. Ruvalds, *Phys. Rev. Lett.*, 67, 1657 (1991).

I. Bozovic, *Phys. Rev.*, B42, 1969 (1990).

J.H. Kim, I. Bozovic, C.B. Eom, T.H. Geballe and J.S. Harris, Jr., *Physica*, C174, 435 (1991).

J.P. Tidman and R.F. Frindt, *Can. J. Phys.*, 54, 2306 (1976).

F.J. DiSalva and J.E. Graebner, *Solid State Commun.*, 23, 825 (1977).

A.I. Rusinov, Do Chan Kat and Yu V. Kopaev, *Sov. Phys. JETP*, 38, 991 (1974).

S.J. Allen, Jr., N. Tabatabaie, C.J. Palmstrom, G.W. Hull, T. Sands, F. De Rosa, H.L. Gilchrist and K.C. Garrison, *Phys. Rev. Lett.*, 62, 2309 (1989).

T. Sands, *Appl. Phys. Lett.*, 52, 197 (1988).

J.P. Harbison, T. Sands, N. Tabatabaie, W.K. Chan, L.T. Florez, and V.G. Keramidas, *Appl. Phys. Lett.*, 53, 1717 (1988).

J.E. Cunningham, J.A. Dura and C.P. Flynn, in Metalic Multilayer and Epitaxy, ed. by M. Hong, S. Wolf and D.C. Gubser, *Metallurgical Society Inc.* (1988).

B.C. Cullity, Elements of X–ray Diffraction, Addison–Wesley, 32–81 (2nd ed.).

J.P. Issi, *Aust. J. Phys.*, 32, 585 (1979).

M.A. Herman and H. Sitter, Molecular Beam Epitaxy, Ed. Springer–Verlag (1989).

C.N. Berglund, *IEEE Trans. Electron DEV* Ed–16, 432 (1969).

D.L. Mitchell, P.C. Taylor and S.G. Bishop, *Solid State Comm.* 9, 1833 (1971).

P.A. Wolff and S.Y. Auyang, *Semicond. Sci. Technol.* 5, S57 (1990).

E.R. Youngdale, C.A. Hoffman, J.R. Meyer, F.J. Bartoli, X. Chu, J.P. Faurie, J.W. Han, J.W. Cook, Jr. and J.F. Schetzina, *J.Vac. Sci. Technol.* A 7, 365 (1989).

E.R. Youngdale, C.A. Hoffman, J.R. Meyer, F.J. Bartoli, J.W. Han, J.W. Cook, Jr., J.F. Schetzina, M.A. Engelhardt, E.W. Niles and H. Hochst, *J. Vac. Sci. Technol.* A 8, 1215 (1990).

E.R. Youngdale, C.A. Hoffmann, J.R. Meyer, F.J. Bartoli, M.A. Engelhardt and H. Hochst, *Semicond. Sci. Technol.* 5, S253 (1990).

E.R. Youngdale, J.R. Meyer, C.A. Hoffmann, F.J. Bartoli and A. Martinez, *Solid State Comm.* 80, 95 (1991).

E.R. Youngdale, J.R. Meyer, C.A. Hoffman, F.J. Bartoli, D.L. Partin, C.M. Thrush and J.P. Heremans, *Appl. Phys. Lett.* 57, 336 (1990).

E.R. Youngdale, J.R. Meyer, C.A. Hoffman, F.J. Bartoli, D.L. Partin, C.M. Thrush and J.P. Heremans, *Appl. Phys. Lett.*, 59, 756 (1991).

E.R. Youngdale, J.R. Meyer, F.J. Bartoli and C.A. Hoffman, *Int. J. Nonlinear Opt. Phys.*, vol. 1, No. 3 (1992) 493, 531.

R.M. Broudy and V.J. Mazurezyk, *Semiconductors and Semimetals*, vol. 18, ed. R. K. Willardson and A.C. Beer (Academic, New York, 1981), Chapter 5.

M.B. Reine, A.K. Sood an T.J. Tredwell, *Semiconductors and Semimetals*, vol. 18, ed. R.K. Willardson and A.C. Beer (Academic, New York, 1981), Chapter 6.

M.A. Kinch and M.W. Goodwin, *J. Appl. Phys.* 58, 4455 (1985).

J.R. Meyer, F.J. Bartoli, E.R. Youngdale and C.A. Hoffmann, *J. Appl. Phys.* 70, 4317 (1991).

S.C. Shin, J.E. Hilliard and J.B. Ketterson, *J. Vac. Sci. Technol.* A2, 296 (1984).

A. diVenere, H.K. Wong, G.K. Wong and J.B. Ketterson, *Superlatt. Microstruct.* 1, 21 (1985).

T.D. Golding, J.A. Dura, H. Wang, J.T. Zborowski, A. Vigliante, D.C. Chen, J.H. Miller, Jr. and J.R. Meyer, *Semicond. Sci. Technol.*, 8 (1993) S117–S120.

K. Kash, P.A. Wolff and W.A. Bonner, *Appl. Phys. Lett.* 42, 173 (1983).

K. Seeger, *Semiconductor Physics* (Springer–Verlag, New York, 1973).

J. Heremans, D.T. Morelli, D.L. Partin, C.H. Olk, C.M. Thrush and T.A. Perry, *Phys. Rev. B.* 38, 10280 (1988).

Peter C. Sercel and Kerry J. Vahala, "Type II broken–gap quantum wires and quantum dot arrays: A novel concept for self–doping semiconductor nanostructures," *Appl. Phys. Lett.* 57(15) Oct. 8, 1990, pp. 1569–1571.

T.D. Golding, et al., "Molecular beam epitaxial growth of Sb/GaSb multilayer structures: potential application as a narrow bandgap system, " *Seventh International Conference*, 24–28 (Aug. 1992), vol. 127, No. 1–4, ISSN 0022–0248, and *Journal of Crystal Growth* 127 (Feb. 1993), pp. 777–782.

T.D. Golding, et al., "Investigation of Sb/GaSb multilayer structures for potential application as an indirect narrow–bandgap material," *6th International Conference, Narrow Gap Semiconductors*, 1992, (Jul. 19–23 1992), vol. 8, No. 1S, ISSN 0268–1242, and *Semicond. Sci. Technol.* 8 (1993) S117–S120.

A.Y. Cho and P.D. Dernier, "Single–crystal–aluminum Schottky–barrier diodes prepared by molecular–beam epitaxy (MBE) on GaAs," *J. Appl. Phys.* 49(6), Jun. 1978, pp. 3328–3332.

J.T. Zborowski, et al., "Epitaxial and Interface Properties of InAs/InGaSb Multilayered Structures," *J. Appl. Phys.* 71(12), Jun. 15, 1992, pp. 5908–5912.

Guenais et al, "Vaccum Stability of Epitaxial NiGa and $Ni_2Ga_3$ Layers MBi Grown Onto A GaAs Substrate", J. of Crystal Growth vol. 102 (1990) 925–932.

IBM Technical Disclosure Bulletin, vol. 7(5), Oct. 1964, pp. 411–412; Laff.

Noreika, et al., "Growth of Sb and InSb by Molecular–Beam Epitaxy," *Journal of Applied Physics*, vol. 52, No. 12, pp. 7416–7420 (Dec. 1981).

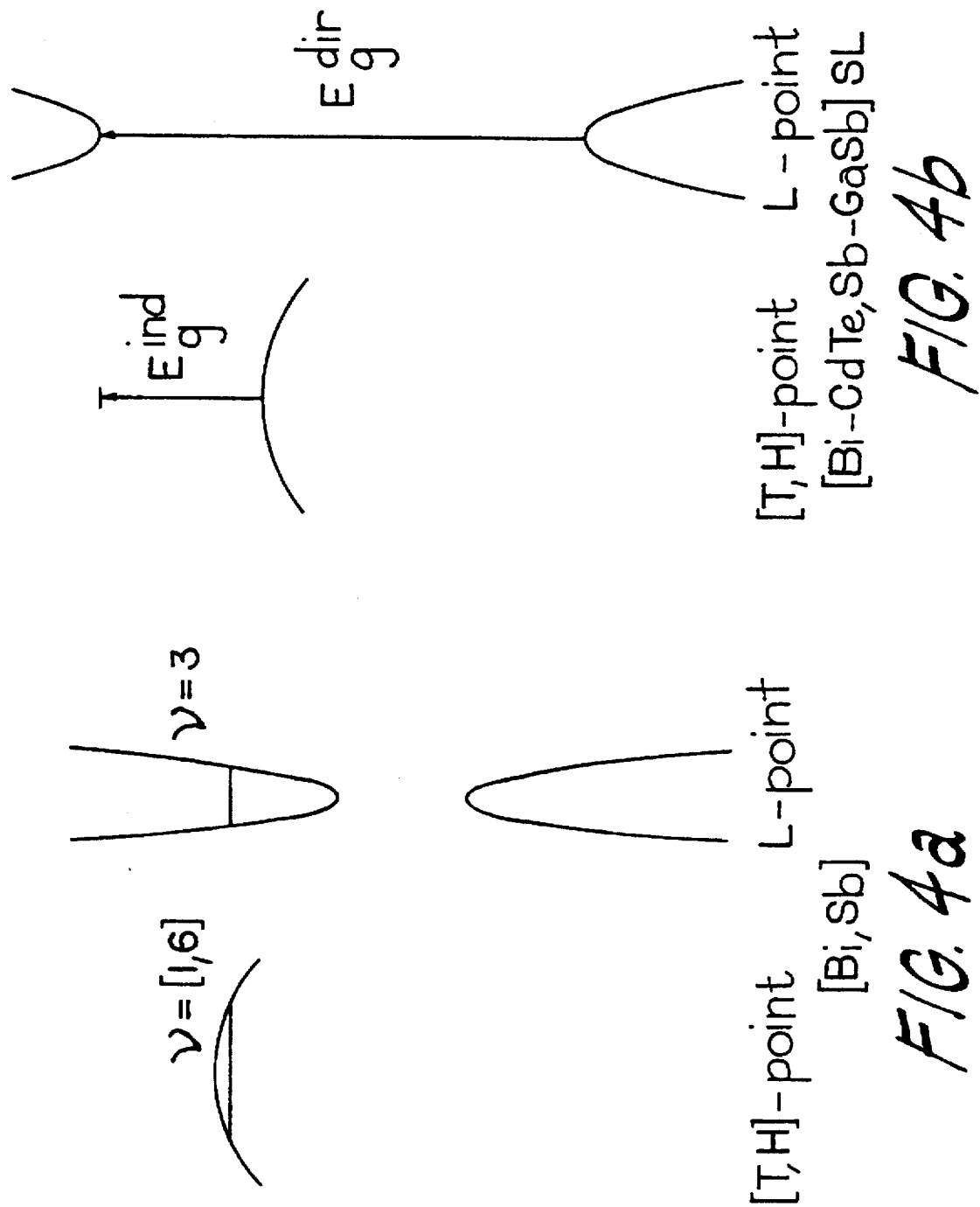

SEMIMETAL-SEMICONDUCTOR HETEROSTRUCTURES AND MULTILAYERS

SPECIFICATION

This is a divisional of application Ser. No. 07/916,050, filed Jul. 17, 1992 and now issued as U.S. Pat. No. 5,449,561.

FIELD OF THE INVENTION

The invention relates to the fabrication of semimetal/semiconductor heterostructures. In particular, the invention relates to the fabrication of one or more combinations of semimetal and semiconductor layers having compatible crystal symmetry across each heterojunction between a given semimetal and the adjoining semiconductor. Any of the semimetal layers sandwiched between semiconductor layers may be grown thin enough that the semimetal layer becomes a semiconductor.

SPECIFICATION

The incorporation of metallic films embedded in a semiconductor device, thereby creating a hybrid structure, has received significant attention. This has primarily been motivated for two reasons: (i) because of the low resistivity of the metals that would enable fabrication of buried contacts, interconnects and ground planes, which are considered essential to the three dimensional integration of semiconductor devices; and (ii) because of the possibility of combining the transport properties of metals and semiconductors to create novel or improved device applications, for example metal base transistors or high frequency switches.

Synthesis of metal/semiconductor hybrid structures impose stringent requirements on the film and heterojunction properties. Specifically, the crystalline quality and thermal stability of both the embedded metallic layer and the semiconductor overgrowth, as well as the integrity of the heterointerfaces, are of paramount importance. While the epitaxial growth of metals on semiconductors is now relatively routine with low temperature growth techniques such as molecular beam epitaxy, for example epitaxial metallization systems reported to be grown on GaAs are Al, Ag, Fe, and body-centered-cubic Co among others, see A. Y. Cho and P. D. Dernier, *J. Phys.*, 49.3328 (1978); J. Massies, P. Delescluse, P. Etienne and N. T. Linh, *Thin Solid Films*, 90, 113(1980); J. R. Waldrop and R. W. Grant, *Appl. Phys.Lett.*, 34, 630 (1979); G. A. Prinz and J. J. Krebs, *Appl. Phys. Lett.*, 39.397 (1981); and G. A. Prinz, *Phys. Rev. Lett.*, 54, 1051 (1985) which are incorporated herein by reference, it is noted that these metal/semiconductors heterostructures are not thermodynamically stable since the metals will react with As and/or Ga to form metal—As (M—As) and metal—Ga (M—Ga) compounds. In addition, the Al-containing compounds are susceptible to an Al/Ga exchange reaction at elevated temperatures. A much more serious limitation has been the inability to grow high quality single crystal semiconductor films on deposited metal layers.

Key factors for consideration in fabricating hybrid structures have involved the differences in crystal structure, thermal stability, bonding disparities, and growth compatibility of the constituent materials. While such factors have seriously hindered the fabrication of buried metal structures, the growth of a semiconductor on metal (NiAl/GaAs) has been reported. See T. Sands, *Appl. Phys. Lett.*, 52,197 (1988), and J. P. Harbison, T. Sands, N. Tabatabaie, W. K. Chan, L. T. Florez, and V. G. Keramidas, *Appl. Phys. Lett.*, 53, 1717 (1988) which are incorporated herein by reference. However, fabrication of only a single semiconductor/metal layer has been achieved. An alternative approach has involved incorporating a semimetal, rather than a conventional metal, into the heterostructure. Recently, ErAs has been successfully grown on GaAs and shown to exhibit semimetallic behavior. See C. J. Palmstrom, N. Tabatabaie, and S. J. Allen, Jr., *Appl. Phys. Lett.*, 53, 2608 (1988), which is incorporated herein by reference. Unfortunately, the resistivity of this structure was measured to be 7.2 m$\Omega$ cm—nearly four orders of magnitude higher than the resistivity of copper, and like the prior art NiAl/GaAs structure, only a single layer has been successfully incorporated into a heterostructure. In addition, these prior art systems have inherent problems associated with materials incompatibilities, and differing crystal structures that will continue to plague the performance of electronic devices fabricated with these structures. Put simply, none of the prior art metal/semiconductor or semimetal/semiconductor structures that have been fabricated have achieved optimal heterostructure properties required of potential applications for these structures.

The present invention enables the fabrication of stable, high quality semimetal/semiconductor interfaces and multiple semimetal/semiconductor layers. In addition, the present invention enables semimetal layers in a semimetal/semiconductor multilayer to be fabricated such that the semimetal becomes a semiconductor. The semimetal/semiconductor heterostructures of the present invention are believed to have applications in microelectronics devices, especially high speed microelectronics, optical devices, mesoscopic physics, and potentially high-temperature superconductivity.

SUMMARY OF THE INVENTION

The present invention provides novel and useful semimetal/semiconductor heterostructures and multilayers. In accordance with the present invention, stable, high quality semimetal-semiconductor interfaces can be fabricated by exploiting a compatible crystal symmetry across the heterojunction between a semimetal and a semiconductor.

The semimetal/semiconductor heterostructures are fabricated by growing a rhombohedral semimetal in a [111] direction on a substrate material having a [111] orientation, and then growing a zincblende semiconductor in a [111] direction on the rhombohedral semimetal. Suitable rhombohedral semimetals include $Bi_xSb_{1-x}$, or As, while suitable zincblende semiconductors include $In_xGa_{1-x}Sb$, $In_xGa_{1-x}As$, $Al_xGa_{1-x}As$, or $Al_xGa_{1-x}Sb$, where x ranges from zero to one. The substrate material can comprise numerous materials including, but not limited to $In_xGa_{1-x}Sb$, $In_xGa_{1-x}As$, $Al_xGa_{1-x}As$, $Al_xGa_{1-x}Sb$, or $Al_2O_3$.

Unlike the prior art, the present invention enables multiple semimetal/semiconductor layers to be fabricated. A single layer semimetal/semiconductor heterostructure, comprising a rhombohedral semimetal grown in a [111] direction on a substrate and a zincblende semiconductor grown in a [111] direction on the semimetal, is utilized in effect as the base of the semimetal/semiconductor multilayer structure. Alternating layers of rhombohedral semimetal, grown in a [111] on the preceding semiconductor layer grown, and zincblende semiconductor, grown in a [111] direction on the preceding semimetal layer grown, are then fabricated on the base. The number of semimetal/semiconductor layers grown is dependent on the application of the semimetal/semiconductor multilayer structure.

The semimetal/semiconductor heterostructures and multilayer structures may be grown by any low temperature epitaxial growth process. Suitable low temperature epitaxial growth processes include molecular beam epitaxy, chemical beam epitaxy, and metal organic chemical beam epitaxy.

The respective semimetal and semiconductor layers are grown to a thickness which is dependent on the particular application of the semimetal/semiconductor heterostructures or multilayer structures. However, the layers will typically have a thickness in the range of 10–500 Å.

If fabricated in accordance with conventional techniques, the semimetal layers of the semimetal/semiconductor structures of the present invention will likely be fabricated with thicknesses greater than approximately 100 Å such that the semimetal has a low resistivity like metals. Such low resistivity semimetal layers in the semimetal/semiconductor structures may find applications as buried contacts, interconnects and ground planes. Such applications were previously envisioned primarily for metal/semiconductor hybrid structures.

The inventors have also discovered that if a semimetal layer in a semimetal/semiconductor multilayer structure of the present invention is sandwiched between semiconductor layers and is fabricated thin enough, then the semimetal becomes a semiconductor. The thickness $L_z$ of the semimetal must be comparable to or less than the de Broglie wavelength of the carriers. In general, the thickness $L_z$, must be less than 100 Å.

The semimetal/semiconductor heterostructures and multilayer structures are believed to have been useful applications in: microelectronic devices, especially high speed microelectronics, optical devices, mesoscopic physics, and high-temperature superconductivity.

BRIEF DESCRIPTION OF THE DRAWINGS

A better understanding of the present invention can be obtained when the following detailed description is read in conjunction with the following drawings in which:

FIG. 4a is a diagram of energy versus wavenumber (k) for Bi or Sb [Bi,Sb] in bulk form; and FIG. 4b is a diagram of energy versus wavenumber (k) for Bi or Sb [Bi,Sb] confined in a quantum well.

DETAILED DESCRIPTION OF THE INVENTION

A. Introduction

Figure 1:
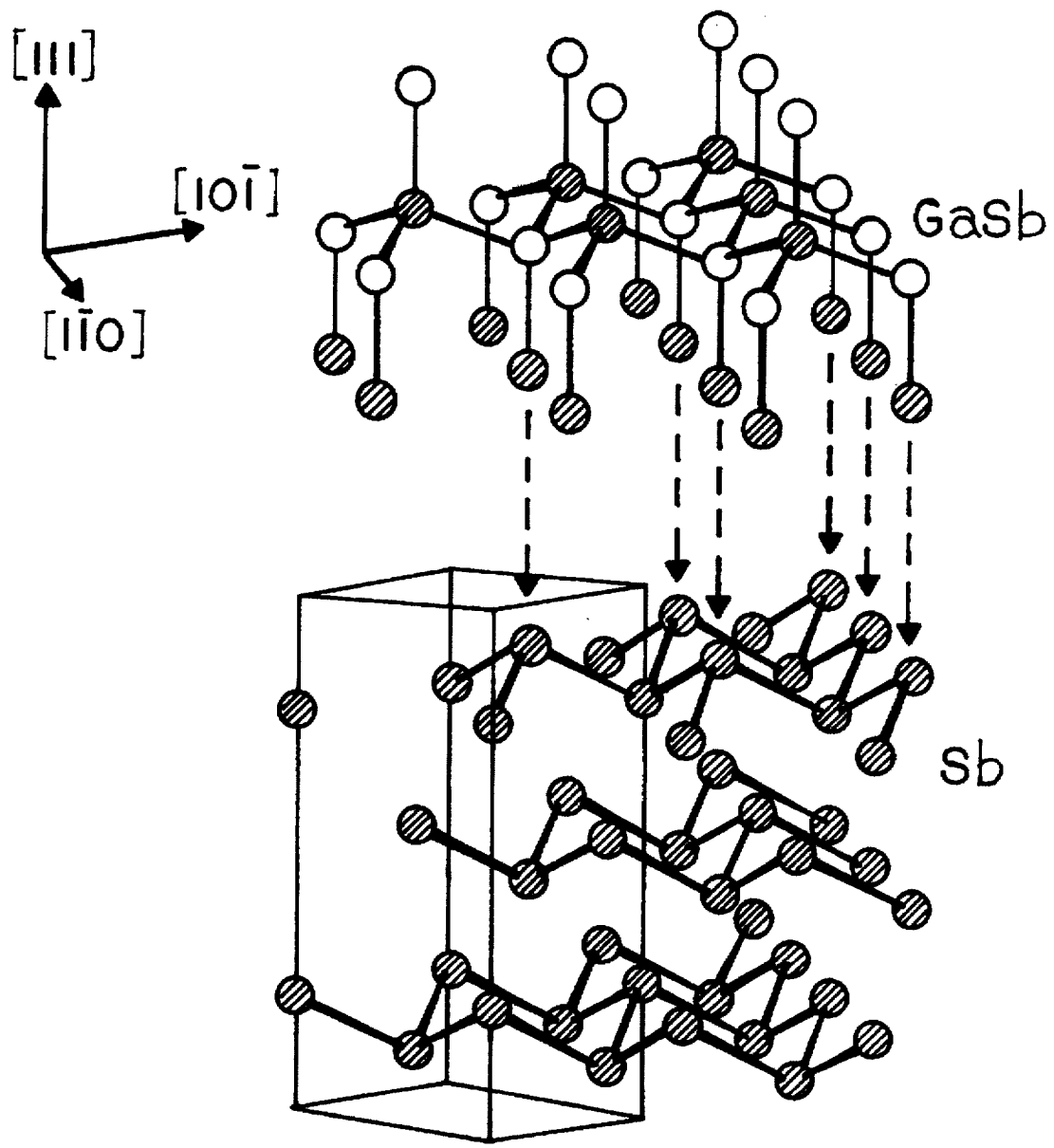
FIG. 1 is a perspective view illustrating compatible crystal symmetry across the heterojunction between rhombohedral semimetal and zincblende semiconductor crystals in accordance with the present invention.

Recent developments by the inventors now enable, for the first time, the fabrication of stable, high quality semimetal-semiconductor interfaces and multilayers consisting of the zincblende III-V semiconductor family (for example GaSb, InAs, AlSb, GaAs, InP) and the semimetals that have a rhombohedral crystal structure (for example Sb, Bi and As, and associated alloys). See T. D. Golding, H. D. Shih, J. T. Zbororwski, W. C. Fan, P. C. Chow, A. Vigilante, B. C. Covington, A. Chi, J. M. Anthony and H. F. Schaake, B10 (2) (1992) 880–84 and T. D. Golding, J. A. Dura, W. C. Wang, J. T. Zborowski, A. Viliante, and J. H. Miller, Jr., "Investigation of Sb/GaSb Multilayer Structures for Potential Application as an Indirect Narrow Bandgap Material" Semicond. Sci. Technol. 8 (1983) S117–S120 which are incorporated herein by reference. The semimetal layers have been found to have extremely low room temperature resistivities, significantly lower than that of copper. See T. D. Golding, J. A. Dura, W. C. Wang, J. T. Zborowski, A. Viliante, and J. H. Miller, Jr., "Investigation of Sb/GaSb Multilayer Structures for Potential Application as an Indirect Narrow Bandgap Material" Semicond. Sci. Technol. 8 (1983) S117–S120. The present invention overcomes the limitation of prior art investigations and concepts and also significantly extends the range of applications that have been able to be envisioned in the conventional metal/semiconductor hybrid structures.

The present invention overcomes the disparity in crystal structure of semimetal and semiconductor materials by utilizing a common crystal symmetry across the heterojunction of rhombohedral semimetal and zincblende semiconductor crystals. This results in the ability to grow semimetals on semiconductors and reciprocal structures with exact registry of the two lattices across the interface. This permits, therefore, the fabrication of very high quality heterointerfaces without dislocations, and dangling bonds, for example.

The semimetal layers in the semimetal/semiconductor structures fabricated by conventional techniques have similar conductivities to metals. In addition, the semimetals unlike metals, may be converted into semiconductors using quantum size effects. During the fabrication of the semimetal/semiconductor structures, the thickness of the semimetal layers may affect whether the semimetal layer is converted into a semiconductor.

B. Description

The difficulty in the prior art with fabricating hybrid heterostructures has involved the disparity in the crystal structures of the constituent materials which prevent the formation of high quality, defect free heterojunctions. However, it has been known in the prior art that when, on specifically chosen grown planes, two crystal structures have a compatible surface lattice they can be exploited for heteroepitaxial growth. The surface registry can occur either in a supercell, or when the naturally occurring primary surface unit cell of two different crystal structures is identical (to within only a small mismatch in lattice constants). See A. Zur and T. C. McGill, J. Appl. Phys., 55, 378 (1984), and J. E. Cunningham, J. A. dura and C. P. Flynn, in Metallic Multilayer and Epitaxy, ed. by M. Hong, S. Wolf and D. C. Gubser, Metallurgical Society Inc. (1988) which are incorporated herein by reference. It is this latter form of matching which the present invention exploits to create a new group of semimetal/semiconductor structures.

It has been discovered that single layer and multilayer semimetal/semiconductor structures can be fabricated with rhombohedral semimetals having a (111) orientation and zincblende semiconductors having a (111) orientation. Suitable rhombohedral semimetals include $Bi_xSb_{1-x}$ or As, while suitable zincblende semiconductors include $In_xGa_{1-x}Sb$, $In_xGa_{1-x}As$, $Al_xGa_{1-x}As$, or $Al_xGa_{1-x}Sb$, where x ranges from zero to one.

The following discussion relates to the fabrication of a GaSb/Sb semiconductor/semimetal heterostructure, however the discussion is also relevant to fabrication of other rhombohedral semimetal/zincblende semiconductor structures. The bulk structure of Sb is rhombohedral (trigonal) lattice parameter a=4.506 Å and α=57.11°, see Elements of X-ray Diffraction, B. C. Cullity, Addison-Wesley pp. 32–81 (2nd Ed.) which is incorporated herein by reference, while GaSb is zincblende with a=6.096 Å. The (111) plane of Sb forms a hexagonal net which is structurally nearly identical to that of GaSb in its (111) plane. The in-plane interatomic distance in Sb and GaSb is 4.308 Å and 4.310 Å, respectively, resulting in a (111) planar mismatch, $\alpha a_j/a_i$, of only 0.0006 (at 273K). Therefore, formation of defect free, strainless interfaces are a possibility with this system if grown on the (111) orientation. In addition, the coefficients of linear expansion of Sb and GaSb are comparable ($\alpha GaSb=6.9\times10^{-6}$, $\alpha Sb=9\times10^{-6}$) and potential cross doping effects which have been of concern in some of the prior art mixed semimetal/semiconductor combinations are eliminated because Sb is common in Sb/GaSb structures. FIG. 1 illustrates compatible crystal symmetry across the heterojunction between the zincblende semiconductor crystal GaSb and the rhombohedral semimetal crystal Sb.

Figure 2:
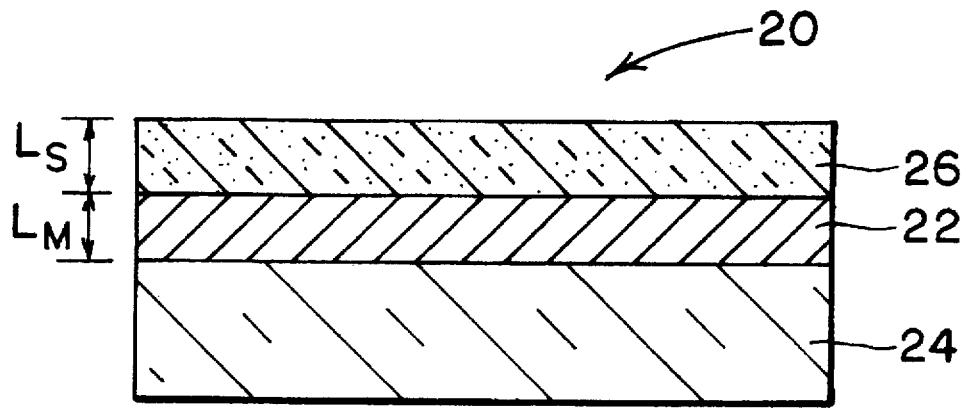
FIG. 2 is a side view of a single layer semimetal/semiconductor heterostructure in accordance with the present invention.

The semiconductor/semimetal structures can be grown by any low temperature epitaxial growth process. In order to ensure that the common crystal symmetry is exploited the semimetal and semiconductor layers must be grown along the [111] direction, and this necessitates growth on a (111) oriented substrate or template that has an atomic surface structure that is six fold symmetric. Suitable substrates include, but are not limited to $In_xGa_{1-x}Sb$, $In_xGa_{1-x}As$, $Al_xGa_{1-x}As$, or $Al_xGa_{1-x}Sb$. Specific examples of suitable substrates are InAs(111), GaSb(111), GaAs(111) or sapphire (111) ($Al_2O_3$). In general, to fabricate a single layer semimetal/semiconductor heterostructure 20 (see FIG. 2), a rhombohedral semimetal 22 is grown in a [111] direction on substrate 24 having a (111) orientation. A zincblende semiconductor 26 is then grown in a [111] direction on semimetal 22.

The following is a more detailed description of the fabrication of a semimetal/semiconductor structure. Although the discussion is limited to a Sb/GaSb structure, it is equally applicable to the range of rhombohedral semimetals, and the zincblende semiconductor materials previously mentioned.

The Sb semimetal and GaSb semiconductor films are grown by molecular beam epitaxy (MBE) in a commercial (Riber 32) growth chamber, using a standard Sb effusion cell producing $Sb_4$, and a standard liquid-metal Ga source. See "Molecular Beam Epitaxy" Ed. M. a. Herman and H. Sitter, Springer-Verlag (1989) which is incorporated herein by reference; see also T. D. Golding, J. A. Dura, W. C. Wang, J. T. Zborowski, A. Viliante, and J. H. Miller, Jr., "Investigation of Sb/GaSb Multilayer Structures for Potential Application as a Narrow Bandgap System," Accepted for presentation at the International Conference on Narrow-Gap Semiconductors, University of Southhampton, U.K., 19–23 Jul. 1992. Other growth techniques besides MBE, such as chemical beam epitaxy, and metal organic chemical beam epitaxy are equally suitable. The substrates employed are GaSb(111)A and (111)B oriented, and are indium-bonded to Molybdenum blocks. Homoepitaxial GaSb buffer layers of approximately 0.51 µm may be grown prior to epilayer or multilayer growth, although this is not essential. Molecular fluxes are determined from measurements by an ion gauge interposed in the beam path. Substrate temperatures above 425° C. are measured by an optical pyrometer, and below 425° C. are estimated by extrapolating readings from a thermocouple mounted behind the sample block. Growth is monitored by in-situ reflection high energy electron diffraction (RHEED). Growth rates for Sb are calibrated by Rutherford backscattering spectrometry (RBS), and growth rates for GaSb by RHEED intensity oscillations and RBS.

Epitaxial grown of Sb on both GaSb (111)A and (111)B is achieved by increasing the Sb residence lifetime on the GaSb surface by lowering the temperature below a nucleation temperature, $T_n(J_{sb})$, which is independent of the growth orientation. For $J_{Sb}=7\times10^{-7}$ torr, $T_n$ is equal to 260° C. for epitaxial growth of Sb on GaSb. For epitaxy on both GaSb (111)A and (111)B, initial growth is slow and simultaneous diffraction from epitaxial Sb and GaSb is observed by reflection high energy electron diffraction (RHEED). A streaked, well defined (1×1) RHEED pattern, showing single phase, two dimensional growth results after surface coverage is complete. It is noted that with nearly identical surface nets, the (111) Sb is distinguishable from (111)A or (111)B GaSb only by the RHEED surface reconstructions. At $T_n$, and with the flux ratios $$\frac{J_{Sb}}{J_{Ga}} \approx 1.1,$$

the surface reconstructions for GaSb(111)A and (111)B are 5×2 and 2×8, respectively. Unlike GaSb, the Sb surface has inversion symmetry about the 111 plane and has a 1×1 reconstruction regardless of whether grown on Gasb (111)A or (111)B. Epitaxial growth, once established, may be continued to approximately 200° C. Below this temperature, diffraction rings indicative of polycrystalline grown are observed.

It is noted that with Sb flux constantly present on the GaSb surface, slow initial growth, where surface accommodation and desorption are only slightly unbalanced, is a critical condition for epitaxy. For example, if the surface concentration of Sb is increased rapidly, by cooling quickly through $T_n$, multiply oriented, three-dimensional growth occurs. However, and most importantly, Sb may be successfully nucleated below $T_n$ if the GaSb surface is not exposed to a Sb flux for a period of several seconds.

After deposition of the Sb layer to the required thickness, GaSb can be grown epitaxially on top of the Sb layer by standard MBE growth techniques, and the fabrication of a single layer semimetal/semiconductor heterostructure is complete. To fabricate a multilayer semimetal/semiconductor structure, another Sb layer may be grown on top of the just grown GaSb layer by the technique described above, and then another GaSb layer may be grown by standard MBE growth techniques on the just grown Sb layer. This pattern is repeated until the desired number of alternating semimetal and semiconductor layers have been fabricated.

Figure 3:
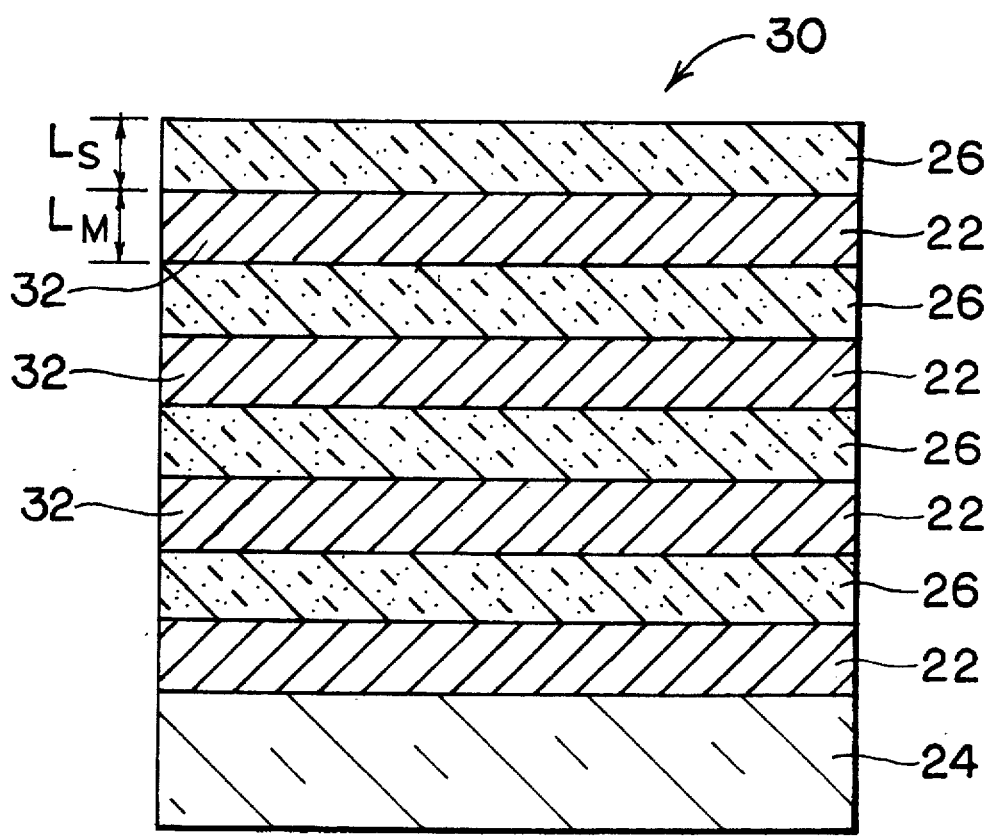
FIG. 3 is a side view of a multilayer semimetal/semiconductor structure in accordance with the present invention.

A schematic of a generic semimetal/semiconductor multilayer structure 30 is shown in FIG. 3. FIG. 3 illustrates substrate 24 and multiple semimetal layers 22 and semiconductor layers 26. The number of semimetal/semiconductor layers is dependent on the device or device characteristics required. It is also noted that the semimetal/semiconductor combinations employed in the semimetal/semiconductor structure are dependent on device characteristics desired, but are restricted to those combinations with close lattice match, such as GaSb/Sb. The layer thicknesses for each semimetal layer ($L_m$) and each semiconductor layer ($L_s$) is also dependent on the device characteristics required and specific materials employed, but $L_m$ and $L_s$ will typically have values in the range 10–500 Å. When the semimetal layers have a thickness greater than about 100 Å, they have resistivities comparable to metals. As will be discussed in more detail below, such low resistivity layers may find applications as buried contacts, interconnects and ground planes. Such applications were previously envisioned primarily for metal/semiconductor hybrid structures. As will be discussed below, the thickness $L_m$ for a semimetal sandwiched between semiconductor layers may be made thin enough, in accordance with the quantum size effect, that the semimetal becomes a semiconductor.

The quantum size effect is generally defined as a dependence of the thermodynamic properties and kinetic coefficients of a solid on its characteristic geometric dimensions when the latter becomes comparable to or less than the de Broglie wavelength of the charge carriers. When the thickness of the solid ($L_z$) is comparable to or less than the de Broglie wavelength of the solid's carriers, quantization of the carrier motion occurs.

In the absence of quantum confinement As, Sb, Bi, or $Bi_xSb_{1-x}$, are semimetals. For these materials the conduction band minimum (3-fold degenerate at the L-point) lies at a lower energy than the valence band maximum (6-fold at the H-point in Sb, 1-fold at the T-point in Bi). The overlap of the two bands is ≈180 meV in Sb and ≈40 meV in Bi. If the semimetal layers are spacially confined by sandwiching the semimetal film between layers of a suitable barrier material, such as GaSb, AlSb or InAs, then by decreasing the thickness of each semimetal layer, the conduction band will move up in energy, while the valence band will move down. See FIG. 4a for a diagram of energy versus wavenumber (k) for Bi or Sb [Bi, Sb] in bulk form, and FIG. 4b for a diagram of energy versus wavenumber (k) for Bi or Sb [Bi, Sb] confined in a quantum well. In the multilayer semimetal/semiconductor structures described above, semiconductor layers 26 sandwiching semimetal layers 32 are suitable barrier material. See FIG. 3. Using appropriate effective masses, see J. P. Issi, *Aust. J. Phys.*, 32, 585 (1979) which is incorporated herein by reference, the two bands should cross at $L_z \approx 100$ Å, where $L_x$ and $L_y$ may be much greater than $L_z$, at which point the semimetal becomes an indirect narrow-gap semiconductor. In general, the thickness below which the two bands cross will depend inversely on the square root of the band overlap, with 100 Åbeing the calculated value for Sb. If the barrier materials are the semiconductors in a semimetal/semiconductor multilayer and are thin enough that there is coupling between adjacent semiconductor layers, the entire semimetal/semiconductor multilayer becomes an indirect narrow-gap superlattice. Like naturally-occurring and man-made semiconductors, the indirect gap of the semiconductors converted from semimetals can have a value between zero to several hundred meV. The indirect gap depends on the thickness of the semiconductor layer converted from a semimetal, and the types of barrier materials used.

C. Applications

1. High speed microelectronics.

Fabrication of low resistance contacts and metallic interconnects is extremely important for high speed microelectronics. The ability to fabricate buried metal structures in semiconductors is expected to lead to many new devices. For example, such metallization schemes show promise for the fabrication of metal base transistors, such as the permeable base transistor (PBT), and resonant tunneling triodes. Metal base transistors are the fastest known threeterminal semiconductor devices, with upper cutoff frequencies above 200 GHz having been achieved in GaAs PBTs. See M. A. Hollis, K. B. Nichols, R. A. Murphy, R. P. Gale, S. Rabe, W. J. Piacenti, C. O. Bozler and P. M. Smith, *IEDM Tech. Digest*, 102 (1985) which is incorporated herein by reference.

The observation of a resonant tunneling component, showing negative differential resistance, in the axial current-voltage characteristics of MBE-grown AlAs/NiAl/AlAs double-barrier structures has been reported. See N. Tabatabaie, T. Sands, J. P. Harbison, H. L. Gilchrist, and V. G. Keramidas, *Appl. Phys. Lett.*, 53, 2528 (1988) which is incorporated herein by reference. This phenomenon is an indication of quantum confinement in the thin NiAl film, and is the first direct observation of two-dimensional electron subband formation in metals. Technologically, this demonstration of resonant conduction through metal quantum wells is an important step towards the fabrication of resonant tunneling resistance, with expected operating frequencies in the THz range. Integration of such a device into semiconductor technology could find applications in the ares of high speed digital circuits, frequency multipliers, and tunable oscillators/amplifiers.

System applications in communications, radar and other areas have stimulated those skilled in the art to attempt to increase the frequencies of operation and improve the noise figures of metal-semiconductor field-effect transistors (MESFETs). The development of a high quality metal-semiconductor Schottky barrier interface is crucial to achieving high performance in these devices. Recently, the fabrication of an all-epitaxial semimetal-semiconductor Schottky diode has been reported. See J. W. Sulhoff, J. L. Zyskind, C. A. Burrus, R. D. Feldman, and R. F. Austin, *Appl. Phys. Lett.*, 56, 388 (1990) which is incorporated herein by reference.

The semimetal layers in the semimetal/semiconductor structures of the present invention may be fabricated with low resistivities like metals. It is expected that the single and multilayer semimetal/semiconductor structures of the present invention will be viable alternatives to metal/semiconductor structures. Furthermore, as discussed above, at present, metal/semiconductor structures are not thermodynamically stable. In addition, currently there is an inability to grow high quality single crystal semiconductor layers on deposited metal layers.

An additional potential benefit of semimetal/semiconductor heterostructures relates to the fact that high carrier concentrations already exist in the semimetal, without the need to introduce high concentrations of donor or acceptor dopants which increase impurity scattering. As a consequence, semimetal films can advantageously replace thin, degenerately doped semiconductor films in numerous devices, such as the modulation-doped field effect transistor (MODFET), for example. In addition, a large shift in the Fermi level for a sufficiently thin semimetal layer, arising from quantum size effects, see M. L. Huberman and J. Maserjian, *Phys. Rev.*, B37, 9065 (1988) which is incorporated herein by reference, suggests that such a semimetal layer would behave as a highly concentrated dopant sheet, which could be incorporated into modulation doped structures. The dopant type is donor or acceptor, depending on whether the semimetal is n-type or p-type, respectively.

In summary, semimetal/semiconductor heterostructures could potentially be utilized for numerous microelectronic device applications.

2. Optical detectors.

Quantum-size effects have been calculated in thin layered semiconductor-metal-semiconductor heterostructures using an ideal free-electron model for the metal layer. See M. L.

Huberman and J. Maserjian, *Phys. Rev.*, B37, 9065 (1988) which is incorporated herein by reference. Optical transitions between quantized subbands are allowed in the metal layer. The possibility of such intersubband transitions suggest optoelectronic applications. At electric fields sufficient to block the conduction normal to the layers, electrons photoexcited into higher quantum states can escape by tunneling through the top of the barrier, producing a photocurrent. Optical detection by intersubband absorption may then be possible in such quantum well structures.

An alternative optical device is a semiconductor/semimetal Schottky ($S^3$) photodiode. Recently, high quantum efficiencies, in the range of 12%, have been achieved for an HgCdTe all-epitaxial $S^3$ photodiode, despite the fact that the device was not optimized for layer thicknesses, carrier concentrations, passivation and other device characteristics. See J. W. Sulhoff, J. L. Zyskind, C. A. Burrus, R. D. Feldman, and R. F. Austin, *Appl. Phys. Lett.*, 56, 388 (1990) which is incorporated herein by reference. Such photovoltaic detectors are of interest for applications in optical communications and for focal plane arrays. The difficulties of forming p-n junctions in $Hg_{1-x}CD_xTE$ by impurity doping are avoided in the $S^3$ photovoltaic detector. In accordance with the present invention, it may be possible to fabricate $S^3$ photodiodes for operation over a broad wavelength range of interest for focal plane arrays if the operating temperature is reduced. With such an all-epitaxial structure, functional layers could be stacked to make integrated structures with more sophisticated capabilities. See also U.S. patent application Ser. No. 07/916,290 by T. Golding et al., entitled "Optical Switches and Detectors Utilizing Indirect Narrow-Gap Superlattice Materials, filed concurrently herewith, which is incorporated herein by reference.

3. Mesoscopic Physics.

New quantum-well structures can be achieved by sandwiching thin metal layers between two semiconductors. Two-dimensional electron gas (2DEG) phenomena, which previously was considered restricted to semiconductors, is observable in metals. Since the metal Fermi energy always lies in the semiconductor band gap, the electrons in the metal at the Fermi energy are confined. Consequently, the normal wave-vector component of the electron states as the Fermi surface is quantized.

The epitaxial Sb/GaSb layered structures of the present invention are ideally suited for studies in the mesoscopic regime, $\lambda_F \ll L \ll L_\omega$, where $\lambda_F$ is the Fermi wavelength, L is a typical lateral device dimension, and $L_\omega$ is the phase coherence length, which is determined primarily by the inelastic diffusion length. The use of epitaxial Sb in mesoscopic structures is advantageous, both because the carrier concentration is substantially higher, and, consequently, $\lambda_F$ is smaller, than that attainable in a typical 2DEG in a semiconductor heterostructure, and also because the inelastic diffusion length is longer than in conventional metals, such as gold. Phenomena which can be investigated with mesoscopic structures include, but are not limited to, universal conductance fluctuations, persistent currents in normal metal rings, ballistic electron optics in two-dimensional electron systems, single electron double barrier resonant tunneling through quantum dots, and electron transport through an "antidot" array.

4. Collective Electrical Transport Phenomena.

An exciting possibility is the prospect of observing phase transitions to ground states exhibiting collective electrical transport phenomena, including charge-density-waves (CDWs), antiferromagnetism, and novel mechanisms of superconductivity. One such novel mechanism includes the exciton pairing mechanism, proposed by Ginzburg, Bardeen and other investigators, see W. A. Little, *Phys. Rev.*, 134, A1416 (1964); V. L. Ginzburg, *Usp. Fiz. Nauk*, 101, 185 (1970). [*Sov. Phys.-Usp.*, 13, 335 (1970)]; and D. Allender, J. Bray, and J. Bardeen, *Phys. Rev.*, B 7, 1020 (1973) which are incorporated herein by reference, which has been predicted to cause superconductivity with high transition temperatures in suitable thin metallic films in intimate contact with narrow bandgap semiconductors and in suitably designed metal-semiconductor superlattices. More recently, a number of investigators, see C. M. Varma, P. B. Littlewood, S. Schmidt-Rink, E. Abrahams, and A. E. Ruckenstein, *Phys. Rev. Lett.*, 63, 1996 (1989), and A. Virosztek and J. Ruvalds, *Phys. Rev. Lett.*, 67, 1657 (1991) which are incorporated herein by reference, have invoked the exciton mechanism in order to explain high temperature superconductivity in the layered cuprates, and the small isotope shift in Tc, and recent experiments, see I. Bozovic, *Phys. Rev.*, B42, 1969 (1990), I. Bozovic, J. H. Kim, J. S. Harris, Jr. and W. Y. Lee, *Phys. Rev.*, B43, 1169 (1991), and J. H. Kim, I. Bozovic, C. B. Eom, T. H. Geballe and J. S. Harris, Jr., *Physica*, C174, 435 (1991) which are incorporated herein by reference, probing the complex dielectric functions of cuprate superconductors provide compelling evidence that virtual electronic excitations indeed play a major role in mediating the pairing in cuprate high Tc superconductors.

The inventors have observed, in two GaSb/Sb multilayer samples fabricated in accordance with the present invention, hysteretic resistive anomalies indicative of a first order phase transition, such as the CDW and commensurability locking transitions observed in 1T-TaS$_2$, see J. P. Tidman and R. F. Frindt, *Can. J. Phys.*, 54, 2306 (1976), F. J. DiSalva and J. E. Graebner, *Solid State Commun.*, 23, 825 (1977), and R. V. Coleman, B. Drake, P. K. Hansma and G. Slough, *Phys. Rev. Lett.*, 55, 394 (1985) which are incorporated herein by reference, and other quasi-two dimensional metals. In a thin film semimetal, such as Sb, with proper choice of the orientation of the thin film, the two-dimensional Fermi surfaces of electrons and holes can be configured to be of approximately equal shape, i.e. $E_e(p)=E_h(p+Q)$ (nesting condition). Here, $E_e(E_h)$ is the electron (hole) energy dispersion and Q is the distance in momentum space between the extreme of these two bands. Under this situation, the system will be unstable with respect to the formation of interband electron and hole pairs, and it will undergo a CDW transition. See A. I. Rusinov, Do Chan Kat and Yu V. Kopaev, *Sov. Phys. JETP*, 38, 991 (1974) which is incorporated herein by reference. This transition in turn induces a $E^{-\frac{1}{2}}$ singularity near the bottom of the conduction band and top of the hole band. When the intraband electrons (holes) form Cooper pairs, either due to phonons, excitons, or two-dimensional acoustic plasmons, the superconducting transition temperature may be significantly enhanced due to the singularity in the density of states. It is expected that there will be an interplay between CDW formation and superconductivity.

The foregoing disclosure and description of the invention are illustrated and explanatory of the preferred embodiments, and changes in the dimension, materials, and fabrication may be made without departing from the spirit of the invention.

What is claimed is:

1. A method of forming a semimetal/semiconductor hybrid material having compatible crystal symmetry across the heterojunction between a semimetal and a semiconductor, comprising the steps of:

(a) providing a substrate material having a (111) orientation;

(b) growing a rhombohedral semimetal in a [111] direction on said substrate material; and (c) growing a zincblende semiconductor in a [111] direction on said rhombohedral semimetal.

2. The method of claim 1 of forming a semimetal/semiconductor hybrid material, wherein said semimetal and said semiconductor are grown using a low temperature epitaxial growth process.

3. The method of claim 2 of forming a semimetal/semiconductor hybrid material, wherein said low temperature epitaxial growth process involves molecular beam epitaxy.

4. A method of forming a semimetal/semiconductor multilayer structure, comprising the steps of:

(a) providing a substrate material having a (111) orientation;

(b) growing a rhombohedral semimetal in a [111] direction on said substrate material;

(c) growing a zincblende semiconductor in a [111] direction on said rhombohedral semimetal;

(d) growing a rhombohedral semimetal in a [111] direction on said zincblende semiconductor; and (e) growing a zincblende semiconductor in a [111] direction on said semimetal grown in step (d).

5. The method of claim 4 of forming a semimetal/semiconductor multilayer structure, wherein said semimetal layers and said semiconductor layers are grown using a low temperature epitaxial growth process.

6. A method of forming a semimetal/semiconductor multilayer structure, comprising the steps of:

(a) providing a substrate material having a (111) orientation;

(b) growing a rhombohedral semimetal in a [111] direction on said substrate material;

(c) growing a zincblende semiconductor in a [111] direction on said rhombohedral semimetal;

(d) growing a rhombohedral semimetal in a [111] direction on said zincblende semiconductor, with a thickness thin enough that said semimetal becomes a semiconductor in said semimetal/semiconductor multilayer structure; and (e) growing a zincblende semiconductor in a [111] direction on said semimetal grown in step (d).

7. The method of claim 6 of forming a semimetal/semiconductor multilayer structure, wherein said semimetal layers and said semiconductor layers are grown using a low temperature epitaxial growth process.

8. A method of forming a semimetal/semiconductor multilayer structure, comprising the steps of:

(a) providing a substrate material having a (111) orientation;

(b) growing a rhombohedral semimetal in a [111] direction on said substrate material;

(c) growing a zincblende semiconductor in a [111] direction on said rhombohedral semimetal;

(d) growing a rhombohedral semimetal in a [111] direction on the preceding zincblende semiconductor grown;

(e) growing a zincblende semiconductor in a [111] direction on the preceding rhombohedral semimetal grown; and (f) repeating both steps (d) and (e) as desired.

9. The method of claim 8 of forming a semimetal/semiconductor multilayer structure, wherein said semimetal layers and said semiconductor layers are grown using a low temperature epitaxial growth process.

10. The method of claim 9 of forming a semimetal/semiconductor multilayer structure, wherein said low temperature epitaxial growth process involves molecular beam epitaxy.

11. The method of claim 8 of forming a semimetal/semiconductor multilayer structure, wherein any or each semimetal grown as a result of performing step (d) is grown with a thickness thin enough that said semimetal becomes a semiconductor in said semimetal/semiconductor multilayer structure.

12. The method of claim 8 of forming a semimetal/semiconductor multilayer structure, further comprising the step of growing a rhombohedral semimetal in a [111] direction on the last grown zincblende semiconductor layer.

13. The method of claim 1 of forming a semimetal/semiconductor hybrid material, wherein said substrate material is $In_xGa_{1-x}Sb, In_xGa_{1-x}As, Al_xGa_{1-x}Sb$, or $Al_2O_3$, where x ranges from zero to one.

14. The method of claim 4 of forming a semimetal/semiconductor hybrid material, wherein said substrate material is $In_xGa_{1-x}Sb, In_xGa_{1-x}As, Al_xGa_{1-x}As, Al_xGa_{1-x}Sb$, or $Al_2O_3$, where x ranges from zero to one.

15. The method of claim 8 of forming a semimetal/semiconductor hybrid material, wherein said substrate material is $In_xGa_{1-x}Sb, In_xGa_{1-x}As, Al_xGa_{1-x}As, Al_xGa_{1-x}Sb$, or $Al_2O_3$, where x ranges from zero to one.

16. The method of claim 8 of forming a semimetal/semiconductor hybrid material, wherein said substrate material is $In_xGa_{1-x}Sb, In_xGa_{1-x}As, Al_xGa_1As, Al_xGa_{1-x}Sb$, or $Al_2O_3$, where x ranges from zero to one.

* * * * *